(12) United States Patent
Wang et al.

(10) Patent No.: US 6,183,655 B1
(45) Date of Patent: Feb. 6, 2001

(54) TUNABLE PROCESS FOR SELECTIVELY ETCHING OXIDE USING FLUOROPROPYLENE AND A HYDROFLUOROCARBON

(75) Inventors: Ruiping Wang, Fremont; Gerald Z. Yin, Cupertino; Robert W. Wu, Pleasanton; Jian Ding, San Jose, all of CA (US)

(73) Assignee: Applied Materials, Inc., Santa Clara, CA (US)

( * ) Notice: Under 35 U.S.C. 154(b), the term of this patent shall be extended for 0 days.

(21) Appl. No.: 09/049,862

(22) Filed: Mar. 27, 1998

Related U.S. Application Data

(63) Continuation-in-part of application No. 08/964,504, filed on Nov. 5, 1997, which is a continuation-in-part of application No. 08/933,804, filed on Sep. 19, 1997.

(51) Int. Cl.[7] .................................................. C03C 25/68
(52) U.S. Cl. ................. 216/68; 216/72; 216/80; 438/723; 438/738; 438/743
(58) Field of Search .................. 216/67, 68, 69, 216/71, 75, 79; 438/705, 707, 710, 714, 719, 723, 724, 726, 734, 735, 737, 738, 743, 744

(56) References Cited

U.S. PATENT DOCUMENTS

| | | | |
|---|---|---|---|
| 5,176,790 | 1/1993 | Arleo et al. | 156/643 |
| 5,338,399 | 8/1994 | Yanagida | 156/662 |
| 5,356,515 | 10/1994 | Tahara et al. | 156/643 |
| 5,366,590 | 11/1994 | Kadomura | 156/662 |
| 5,423,945 | 6/1995 | Marks et al. | 156/662.1 |
| 5,928,963 | * 7/1999 | Koshiishi | 438/714 |
| 5,972,799 | * 10/1999 | Koshiishi | 438/723 |

FOREIGN PATENT DOCUMENTS

| | | | |
|---|---|---|---|
| 0644 584 A1 | 9/1994 | (EP) . | |
| 57-108267 | 6/1982 | (JP) . | |
| 57-155732 | 9/1982 | (JP) . | |
| 61-133630 | 12/1984 | (JP) | H01L/21/302 |
| 4-346428 | 5/1991 | (JP) | H01L/21/302 |
| 3-276626 | 12/1991 | (JP) | H01L/21/302 |
| 9191002 | 1/1996 | (JP) . | |
| 11186229 | 9/1999 | (JP) . | |
| WO 99/16110 | 4/1999 | (WO) . | |
| WO 99/34419 | 8/1999 | (WO) . | |

\* cited by examiner

*Primary Examiner*—Randy Gulakowski
*Assistant Examiner*—Allan Olsen
(74) *Attorney, Agent, or Firm*—Charles Guenzer

(57) ABSTRACT

A plasma etch process, particularly applicable to a self-aligned contact etch or other advanced structures requiring high-selectivity to nitride or other non-oxide materials and producing no etch stop. The process is preferably performed in a high-density plasma reactor for etching holes with either high or low aspect rations. In this process, hexafluoropropylene ($C_3F_6$) is the principal etching gas and another hydrofluorocarbon such as $CH_2F_2$ or $C_3H_2F_6$ is added at least in part for its polymer-forming ability, which increases selectivity of etching oxide to nitride. The process gas also includes a substantial amount of an inactive gas such as argon. The process gas mixture can be balanced between the active etching gas and the polymer former in proportions to optimize selectivity over other materials without the occurrence of etch stop in narrow contact holes and with a wide process window.

26 Claims, 2 Drawing Sheets

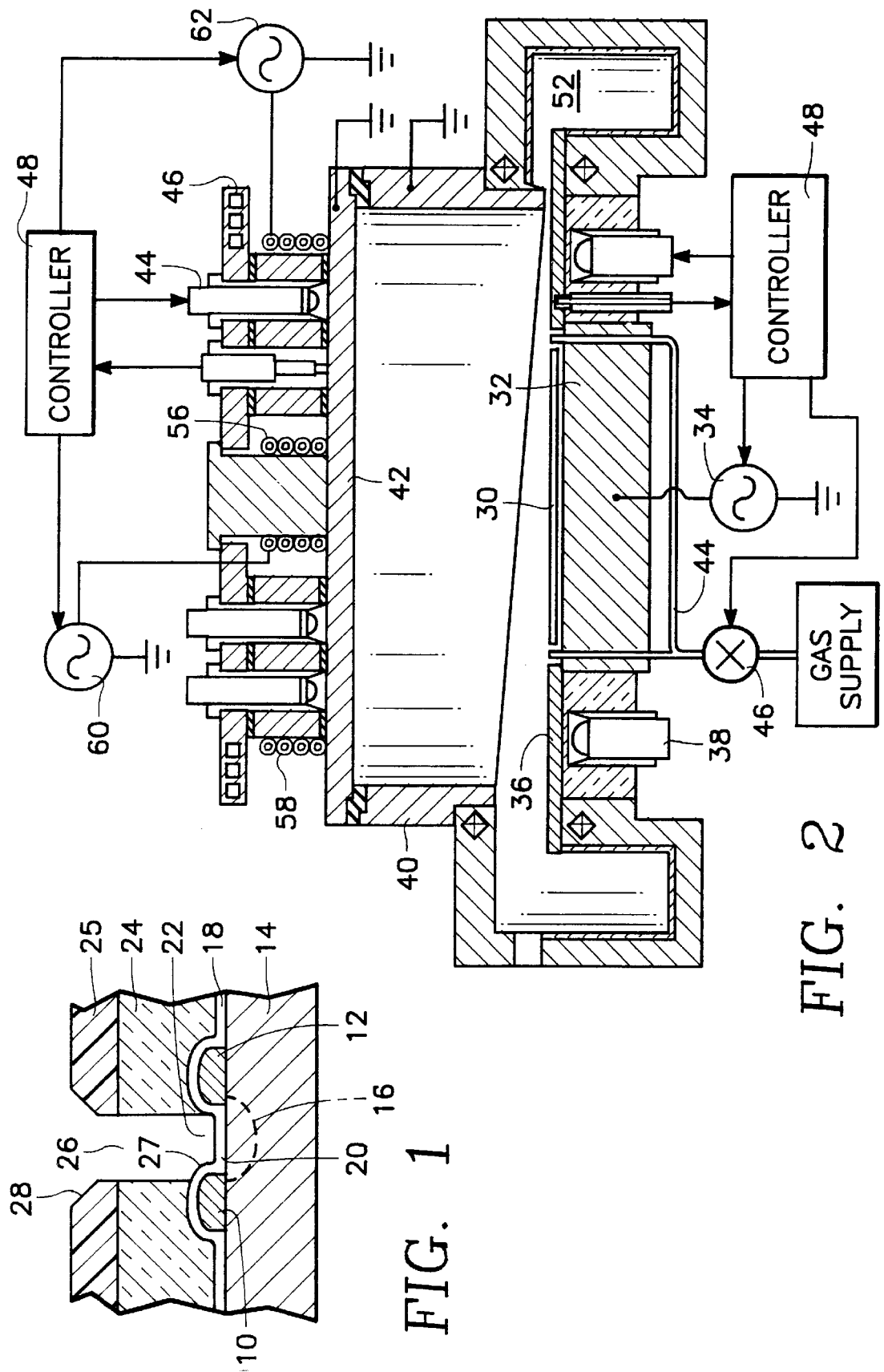

TUNABLE PROCESS FOR SELECTIVELY ETCHING OXIDE USING FLUOROPROPYLENE AND A HYDROFLUOROCARBON

RELATED APPLICATION

This application is a continuation in part of Ser. No. 08/964,504, filed Nov. 5, 1997, which is a continuation in part of Ser. No. 08/933,804, filed Sep. 19, 1997.

FIELD OF THE INVENTION

The invention relates generally to etching in semiconductor processing. In particular, the invention relates to plasma etching of silicon oxide layers, preferably in a process producing high selectivity to silicon nitride or other non-oxide materials and not producing etch stop and exhibiting a wide process window.

BACKGROUND ART

The technology of fabricating semiconductor integrated circuits continues to advance in the number of transistors, capacitors, or other electronic devices that can be fabricated on a single integrated circuit chip. This increasing level of integration is being accomplished in large part by decreasing the minimum feature sizes. Furthermore, advanced processes are being used which are much more tolerant to minute inaccuracies during processing. However, these processes often make extraordinary demands upon the chemistry of the etching process. Oxide etching has presented some of the most difficult demands. Oxide etching refers to the etching of layers of silicon dioxide, silica glass such as BPSG, and related oxide materials that serve as electrical insulators. Advanced integrated circuits contain multiple wiring layers separated from the silicon substrate and from each other by respective oxide layers. Small contact or via holes need to be etched through each of the oxide layers.

An example of an advanced oxide etching process is a self-aligned contact (SAC) process. An example of a SAC structure for two MOS transistors is illustrated in the cross-sectional view of FIG. 1. Two polysilicon lines 10, 12 are deposited and defined over a silicon substrate 14. Each polysilicon line 10, 12 forms a gate structure intended to operate as a gate electrode for a respective MOS transistor. The polysilicon lines 10, 12 act as a mask for the ion implantation of a p-type or n-type dopant into a source region 16 for both of the MOS transistors. Unillustrated drain regions are also formed to complete the principal portions of the MOS transistors. An LPCVD process is used to coat a thin conformal layer 18 of silicon nitride ($Si_3N_4$) on the exposed silicon substrate 14 and on the polysilicon lines 10, 12. A narrow portion 20 of the silicon nitride layer 18 is formed over the silicon substrate 14 in a gap 22 between the nitride-covered gate structures 10, 12. This narrow portion 20 is removed by a post nitride etch following the oxide etch to expose the underlying silicon 14 for contacting. The gap 22 is made as small as possible consistent with subsequent processing in order to increase the integration level.

An oxide layer 24 is then deposited, usually by plasma-enhanced chemical vapor deposition (PECVD), to act as an interlevel dielectric. Considerations of dielectric breakdown with normal operating voltages limit the minimum thickness of the oxide layer 24 to between 0.5 $\mu$m and 1 $\mu$m. A photolithographic step including depositing and photographically defining a photoresist mask 25 followed by an oxide etch forms a contact hole 26 extending to the narrow silicon nitride portion 20 above the silicon source region 16. Following the post nitride etch to remove the narrow silicon nitride portion 20, the contact hole 26 is filled with aluminum or other conductor to form a plug electrically connecting the source region 16 of the two MOS transistors to the wiring level above the dielectric layer 24. The silicon nitride layer 18 acts as an electrical insulator relative to the aluminum plug to isolate the plug from the polysilicon lines 10, 12.

The SAC oxide etch process must satisfy several difficult requirements. The contact hole 26 should be as narrow as possible to increase the integration level, but the oxide thickness is relatively fixed at a significantly larger length. As a result, the contact hole 26 has a high aspect ratio of depth to width. A high aspect ratio can be accomplished only with a highly anisotropic etch, with the wall slope being greater than, for example, 85° and preferably close to 90°.

In view of the large number of structures on a wafer and the variations in oxide thickness, it is highly desirable that the oxide etch be highly selective to silicon nitride, that is, that the etch process etch oxide 24 much more quickly than the underlying silicon nitride 18. The contact hole 26 can then be over etched, for example by 100% of the design depth, to accommodate non-uniformities or process variations, thus assuring that the contact hole reaches the bottom nitride portion 20 over the silicon source region 16. But if the etching manifests high selectivity, there is little etching of the silicon nitride so the source region 16 can be made relatively thin.

If the gap 22 is made very small, various considerations may limit the width of the contact hole 26 to be greater than the size of the gap 22. Also, there may be some uncontrolled variations in the position of the contact hole 26. With a nitride selective etch, the contact hole 26 can overlap the polysilicon lines 10, 12, and small variations of the location of the contact hole 26 can be accommodated while contact to the silicon is still assured. A SAC etch is usually also selective to silicon.

As illustrated, the width of the contact hole 26 is about the same as that of the gap 22 between the nitride-covered polysilicon lines 10, 12, but the photolithographic variations cause the contact hole 26 to be offset from the gap 22 and to expose a corner 27 of the nitride layer. Alternatively, the width of the contact hole 26 may be made significantly larger than the width of the gap 22 so that two nitride corners 27 are exposed. Since the nitride corners 27 are exposed the longest to the oxide etch and the acute corner geometry favors etching, nitride corner loss is often the most critical selectivity issue in contact or via etching. The etch process is subject to other constraints, such as the selectivity to the photoresist 25, which is prone to form facets 28. If the facets 28 extend to the underlying oxide 24, the resolution of the photolithography is degraded. However, nitride corner loss is generally considered to be the most demanding selectivity requirement in a SAC process.

Another difficult oxide etch technique not necessarily involving nitrides is a bi-level contact. A single etch is used to simultaneously etch through an upper oxide inter-level layer to a thin polysilicon line underlying the upper oxide layer and also etch through both the upper and a lower oxide inter-level layer to another polysilicon line underlying the lower oxide layer. This technique requires very high selectivity to silicon to avoid etching through the upper polysilicon line while the lower oxide layer is being etched through.

It is now known that reasonably good oxide etch processes can be achieved by using a fluorocarbon or hydrofluorocarbon etching gas, such as the respective types $CF_4$ or $CHF_3$ or higher-order compounds of the two types. These two types of etchants may be referred to as a hydrogen-free fluorocarbon and a hydrofluorocarbon although the common terminology includes both hydrogen-free fluorocarbons and hydrofluorocarbons as fluorocarbons. Fluorocarbons formed in linear chains are referred to as fluoroalkanes, using standard organic chemistry nomenclature. Under the proper conditions, the fluorocarbon forms a low-fluorine polymer on the silicon and the nitride but not on the oxide. Thereby, the oxide is etched but the silicon and nitride are not. However, if the fluorine content of the etching gas is too high, the fluorine can etch the underlying silicon or nitride and the selectivity is lost. It is believed that $CF_x$ radicals selectively etch oxide over silicon or nitride, but F radicals etch silicon and nitride as well.

The polymer introduces a further problem of etch stop. In narrow deep holes being etched, that is, holes of high aspect ratio, excess polymer is formed over the oxide walls and floor, and etching may stop at a point before the nitride floor is reached. After etch stop, further exposure to the etching plasma does not deepen the hole. Etch stop can also occur in narrow, deep trenches. The critical dimension for a trench is its width, while for a circular hole it is its diameter. Etch stop depends not only upon the aspect ratio of the hole but also upon its critical dimension. As the critical dimension is being pushed to below 0.5 µm and as aspect ratios are being pushed well above two, etch stop has become a serious problem.

Thus, it is seen that advanced oxide etching must satisfy numerous difficult requirements. Further, in commercial applications, the oxide etch rate must be moderately high for reasons of economy in the use of expensive equipment and clean-room floor space. Several approaches have been suggested for addressing these problems. The success of these approaches must be evaluated in terms of a yet further problem of uniformity or reproducibility. Often a process can be finely optimized to satisfy the various requirements of selectivity, etch rate, etc. However, the optimized etching parameters may produce the required results only for a narrow range of the parameters; that is, the process window is narrow. A narrow process window may mean that random fluctuations or uncontrollable drift may bring the process out of specification from one wafer to another, and especially from day to day. Examples of such variations are reaching thermal steady state after the start of a run or after shut down for maintenance, aging of a chamber part, and replacement of a seasoned chamber part with a new part.

Also, in view of the large number of steps involved in advanced circuitry, etching rates need to be uniform to a few percent over the wafer. If the process window is too narrow, the conditions at the center of the wafer may differ sufficiently from those at the wafer edge to produce significantly different results. Hence, a wide process window is required for a commercially feasible process.

In the past, the most typical etchant gases have been $CF_4$ and $CHF_3$. The hydrofluorocarbon $CHF_3$ has been generally assigned a role of promoting polymerization. Higher-order fluorocarbons have been suggested, and some have been used commercially. Yanagida in U.S. Pat. No. 5,338,399 suggests the use of cyclic fluorocarbons, especially saturated hydrogen-free fluorocarbons such as c-$C_3F_6$ and c-$C_4F_8$ which have a monomeric composition of —$CF_2$—, that is, a C/F ratio of ½. Yanagida's results were obtained in a magnetically enhanced capacitively coupled reactor operating at a relatively high pressure of 266 milliTorr, and he observed enhanced selectivity at low temperatures. Yanagida has also disclosed the use of hexafluoropropylene in Japanese Laid-Open Patent Applications 61-133630, 3-276626, and 4-346428.

Tahara et al. in U.S. Pat. No. 5,356,515 suggest the additional use of carbon monoxide (CO) in a similar reactor in combination with $CF_4$ or $CHF_3$ in order to achieve high selectivity. They ascribe the effectiveness of CO to its reducing the $CF_2$ radicals which would otherwise form a polymer on the $SiO_2$ walls of the hole being etched.

Arleo et al. in U.S. Pat. No. 5,176,790 disclose a low-density plasma process for etching vias through an oxide layer to an underlying metal layer. Among several embodiments is a process utilizing high-order linear fluorocarbons and hydrofluorocarbons $C_xH_yF_z$, wherein x is 3 to 6, y is 0 to 3, and z is 2x−y+2. He suggests some examples including $C_3F_8$, $C_3HF_6$, and $C_3H_2F_6$, and $C_3H_3F_5$. Arleo et al. favor pressures in the range of 10 to 20 milliTorr although a wider pressure range is suggested.

Marks et al. in U.S. patent application, Ser. No. 07/826,310, filed Jan. 24, 1992 disclose a plasma process for etching contact holes through an oxide layer to an underlying silicon layer. One of the embodiments of the process uses an etching gas of $SiF_4$ and one of the high-order hydrofluoroalkanes mentioned by Arleo et al. Marks et al. favor operating at a lower pressure of between 1 and 30 milliTorr, although pressures up to 200 milliTorr are included for some applications. Marks et al. in U.S. Pat. No. 5,423,945 disclose a process for selective etching of oxide over nitride using $C_2F_6$ at a pressure of 2 to 30 milliTorr, although $CF_4$ and $C_3F_8$ are mentioned as also preferred. This etching was performed in an inductively coupled high-density plasma reactor with a silicon top electrode. No argon is mentioned.

Recently, high-density plasma (HDP) oxide etchers have become available. Although several methods are available for generating a high-density plasma, the commercially most important configuration uses an RF coil to inductively couple energy into the source region to principally generate the plasma while the pedestal supporting the wafer is a cathode electrode to which RF energy is also applied and which thus biases the wafer relative to the plasma. An example of an HDP oxide etch reactor is the Centura HDP Oxide Etcher available from Applied Materials, Inc. of Santa Clara, Calif. and described by Rice et al. in U.S. Pat. No. 5,477,975. Although HDP etchers offer substantially higher etch rates because of the high plasma density, HDP etchers offer at least two other important, more fundamental advantages.

A first advantage of inductively coupling RF power to generate the plasma is that the bias power applied to the pedestal electrode supporting the wafer can be varied independently of the source power. The bias power determines the sheath voltage adjacent to the wafer and thus determines the energy of ions extracted from the plasma to the wafer. We now know that the typical type of oxide plasma etching, called reactive ion etching, requires both fluorine radicals generated by the plasma and energetic ions impinging the wafer and activating the etching chemistry. The energetic ions may be argon ions used as a carrier gas for the fluorocarbon etching gas. However, if the etch is to stop on silicon, the argon ion energy needs to be reduced to prevent damage to the silicon. A small bias power accomplishes this even though a large source power is generating an intense plasma.

A second advantage of a high-density plasma is that a substantial fraction of the atoms in the plasma are ionized, one definition of a high-density plasma being one having an ions density of at least $10^{11}/cm^3$ throughout the entire volume the plasma fills. This definition excludes the plasma sheaths. The ions density tends to be strongly peaked in a source region near the inductive coils and remote from the wafer, and it tends to fall precipitously toward the wafer. Ionized radicals in the plasma are then accelerated across the bias-controlled plasma sheath so that they arrive at the wafer with a forward directed velocity distribution. This anisotropy in the etchant flux promotes anisotropic etching and prevents micro loading effects at the bottom of high-aspect ratio holes. However, the directional advantage can be obtained only if the plasma is formed in a low pressure gas. If the source region is separated from the wafer by a distance significantly longer than a mean free path of the ionized radicals, which varies inversely with pressure, then the radicals are likely to collide at least once on their way to the wafer, both randomizing the flux and reducing the likelihood of the radical remaining ionized.

For silicon selectivity, Rice et al. rely upon an etching gas composition of $C_2F_6$. Later developments with the same chamber have utilized $C_3F_8$ and $C_4F_8$, which have the higher C/F ratios desired by Yanagida. Rice et al. also rely upon a hot silicon surface for scavenging fluorine from the plasma. The reduction of fluorine results in high selectivity to silicon. The temperature of the silicon-based scavenger needs to be elevated to above about 200° C. to activate the scavenging if only the thermal activation of the solid silicon is being relied upon for the scavenging, and the temperature of other portions of the chamber need to be controlled relative to the scavenger temperature. Marks et al. describe similar silicon-based scavenging to achieve selectivity to nitride in the aforementioned U.S. Patent application.

Another inductively coupled HDP oxide etch chamber is the IPS Oxide Etcher, also available from Applied Materials and described by Collins et al. in U.S. patent application, Ser. No. 08/733,554, filed Oct. 21, 1996. As shown in FIG. 2, a wafer 30 to be processed is supported on a cathode pedestal 32 supplied with RF power from a first RF power supply 34. A silicon ring 36 surrounds the pedestal 32 and is controllably heated by an array of heater lamps 38. A grounded silicon wall 40 surrounds the plasma processing area. A silicon roof 42 overlies plasma processing area, and lamps 44 and water cooling channels 45 control its temperature. The temperature-controlled silicon ring 36 and silicon roof 42 may be used to scavenge fluorine from the fluorocarbon plasma. Processing gas is supplied from one or more bottom gas feeds 46 through a bank of mass flow controllers under the control of a system controller 48. The process recipe is stored in the system controller 48 in magnetic or semiconductor memory. An unillustrated vacuum pumping system connected to a pumping channel 52 around the lower portion of the chamber maintains the chamber at a preselected pressure.

In the used configuration, the silicon roof 42 is grounded, but its semiconductor resistivity and thickness are chosen to pass generally axial RF magnetic fields produced by an inner inductive coil stack 56 and an outer inductive coil stack 58 powered by respective RF power supplies 60, 62.

An example of the need for wide process windows involves the mass flow controllers 46, which typically have a resolution of about 1 sccm (standard cubic centimeter per minute). Some of the prior art recipes use $C_4F_8$ in an HDP etch reactor to achieve high selectivity. However, the process window for these processes have been observed to be in the neighborhood of ±1 scm. Obviously, such a process is difficult to control in a commercial environment. In more general terms, the low resolution of the mass flow controllers argues against any process using only a few sccm of any gas.

It is desired to provide a process for oxide etching that has a wide process window. It is also desired that the process provide other favorable characteristics, such as high selectivity to nitride, a high etch rate, no etch stop, and good verticality. It is further desired that the process be usable in a high-density plasma reactor.

SUMMARY OF THE INVENTION

The invention may be summarized as an oxide etch process using an active etching gas including either fluoropropylene or a closely related hydrofluoropropropylene and a hydrofluorcarbon, preferably in combination with a higher flow of an inactive gas such as argon. The fluoropropylene is a strong oxide etcher capable of a strongly anisotropic etch in the presence of argon, and the hydrofluorocarbon promotes polymer formation and etching selectivity over nitride, silicon, and other non-oxide materials while also not being prone to etch stop ocurring in narrow holes. Examples of the hydrofluorocarbon are $CH_2F_2$ and $C_3H_2F_6$. Also preferably, the etching is performed in a high-density plasma reactor.

These gases can be combined in proportions to achieve optimized performance, for example, balancing selectivity, no etch stop, and a wide process window for various design features with either high or low aspect ratios.

Preferably, a two-step etch process is used in which more polymer former is used in the second step.

BRIEF DESCRIPTION OF THE DRAWINGS

FIG. 1 is a cross-sectional view of a self-aligned contact (SAC) structure in a silicon integrated circuit.

FIG. 2 is a cross-sectional view of a high-density plasma reactor.

DETAILED DESCRIPTION OF THE PREFERRED EMBODIMENTS

Figure 3:
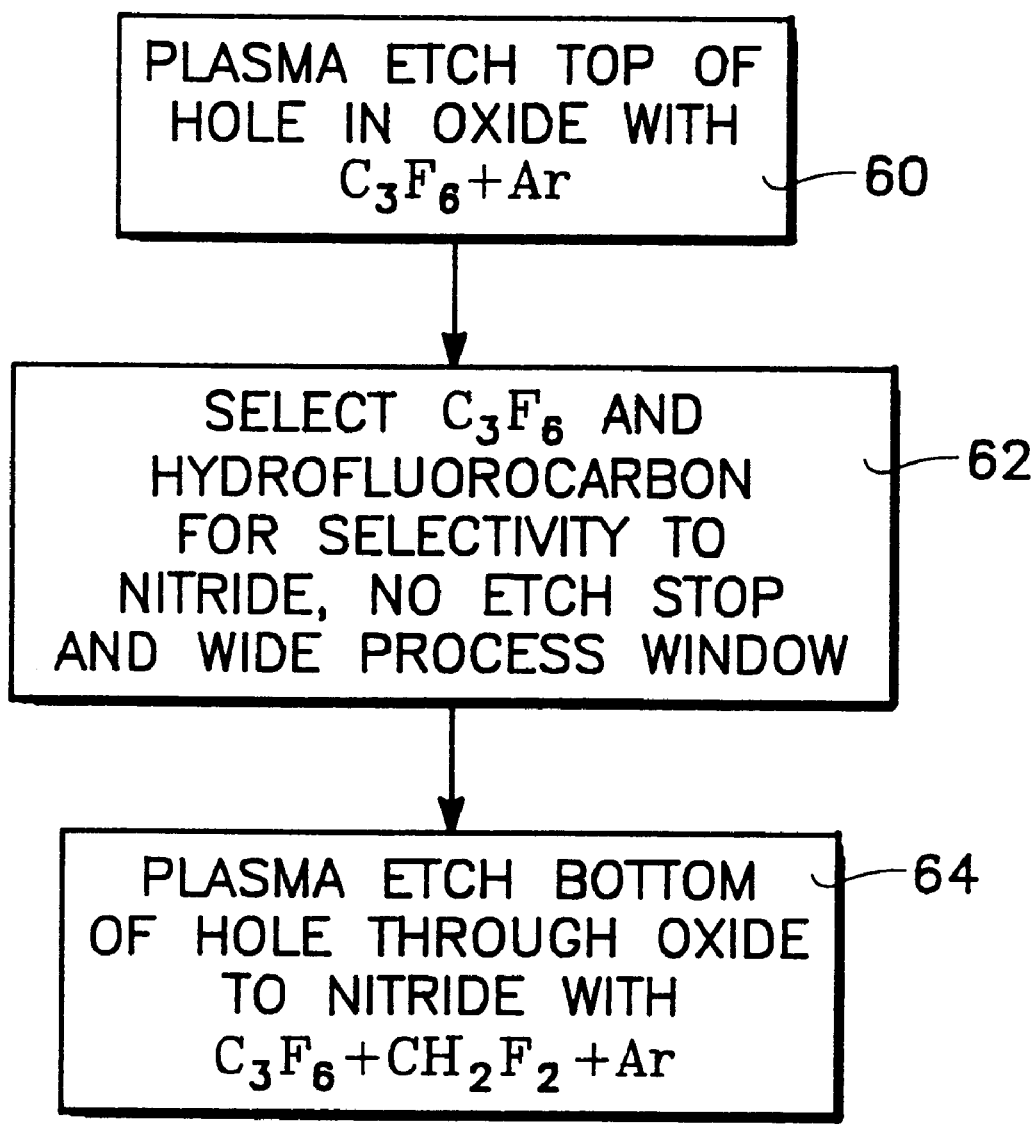
FIG. 3 is a process flow diagram for the practice of one preferred embodiment of the invention.

This invention relies upon the belief that the gas composition and polymer formation can be chosen and controlled for a wide process window and optimized selectivity and characteristics window in oxide etching, particularly at lower pressures (<100 milliTorr) in a high-density plasma. The control according to the invention is achieved by the use of one or more of hydrofluoropropanes, particularly $C_3H_2F_6$ and closely related hydrofluorocarbons.

As observed above, fluorocarbon radicals $CF_x$ promote selective etching of silica, while fluorine radicals F are less selective in etching not only silica but also silicon nitride and silicon. Therefore, for high selectivity to nitride or silicon, the amount of fluorine radical should be minimized. Fluorocarbon or hydrofluorocarbon gases with F/C equal to about 2 are preferred. Gases with high F content (e.g. $CF_4$, $C_2F_6$ etc.) require other mechanism to effectively scavenge the excessive F without causing other side effects. Hydrogen containing gases are often used to scavenge F. However, hydrogen may cause etching profile taper before enough H is introduced. Silicon material can also be used to scavenge fluorine radicals (Rice et al.), however, at least one silicon surface is often kept at high temperature to actively react with F, forming $SiF_4$ gas, which is promptly pumped out of the chamber.

Furthermore, the fluorocarbon or hydrofluorocarbon gas in a plasma has to polymerize enough to deposit on and protect non-oxide surfaces such as silicon nitride and silicon, and yet it should not form too much polymer such as to cause etch stop in narrow holes in the oxide being etched. These countervailing requirements dictate precise control on polymer formation in the plasma reactor. For gases with small monomers of fluorocarbon, such as $CF_4$, $C_2F_6$ or $CHF_3$, high flow and pressure are needed for the polymerization. And these gases generally have high fluorine content, which can destroy selectivity easily if polymer protection is not strong or not optimized. On the other hand, gases with large monomers, such as $C_4F_8$, are very easy to polymerize, perhaps too easy. The control of polymerization rate using $C_4F_8$ as the polymer former often challenges the limit of hardware controllability. As a result, the selectivity is obtained only in a narrow window of process parameters.

We believe that various fluoropropanes compounds take the middle ground. The 3-carbon fluorinated carbon or hydrocarbon compounds have the general formula $C_3H_xF_y$, where x is 0 to 3, y is 5 to 8. This class includes hexafluoropropylene ($C_3F_6$). All these materials contain either carbon and fluorine; or carbon, fluorine and hydrogen. Examples are $C_3F_8$, $C_3HF_7$, $C_3H_2F_6$, $C_3H_3F_5$, $C_3F_6$, etc. Especially preferred are the hydrofluoropropanes $C_3H_xF_{8-9}$, especially where x is 1 to 3. These provide additional hydrogen for a low-fluorine polymer. A popular fluoropropane etching gas is octafluoropropane ($C_3F_8$). Previous development with it has been performed at higher pressures in low-density plasmas, and the reported selectivity is low.

The work defining the invention is divided into two parts. In an initial part, preliminary tests were performed for a varieties of related chemistries, showing the viability of fluoropropane and fluoropropylene chemistries. These results are summarized in TABLE 1. Then, more extensive tests were performed to more tightly establish the process recipe. This second part narrowed the choice of chemistry to $C_3H_2F_6$ and the related hydrofluorocarbons $C_3HF_7$ and $C_3H_3F_5$ for the critical final etch.

Various preliminary process examples related to the invention were tested using structures representative of the SAC structure of FIG. 1. These results are reported in the parent patent application, incorporated herein by reference in its entirety, but those results are mostly repeated here. Two different structures are used. In one type, used in Examples 1–4, 6, 9, 10, silicon-nitride covered islands are formed over a substrate layer of silicon dioxide to allow for a measurement of over etching of the oxide. In these structures, the contact holes have a width of 0.6 μm, which is larger than the gap between the nitride islands. The depth of the oxide to the bottom of the gap is 1.7 μm producing an aspect ratio of 2.8. These latter structures can still test the SAC process requirements since etching of the upper corner of the silicon nitride layer is the most severe test of selectivity to nitride. The other type of structure more closely resembles the SAC structure of FIG. 1 with silicon nitride at the bottom of the hole. The contact hole has a width at its top of between 0.35 and 0.4 μm, and has one side in the gap between the silicon nitride islands and the other side on top of an island. The depth of the contact hole to the bottom of the gap is 1 μm producing an aspect ratio of at least 2.5. For these structures, a separate corresponding patterned oxide wafer was used to calculate the etch rate and selectivity.

In all the examples, except where specifically noted, the silicon roof was held at 200° C., and the silicon ring was held at 270° C. The pedestal was chilled to 10 to 14° C., and a helium thermal contact gas was held at 5 to 7 Torr between the wafer and the pedestal. Etching times were in the range of 85 to 280 seconds. The process conditions for these experiments are summarized in TABLE 1. Only the total power to the two ceiling coils is given since the total power is believed to more directly affect the plasma chemistry. The division of power between the ceiling coils is used to increase uniformity.

TABLE 1

| Example | Fluorocarbon Comp. | Fluorocarbon Flow (sccm) | $CH_2F_2$ Flow (sccm) | Argon Flow (sccm) | Pressure (m/Torr) | Coil Power (W) | Bias Power (W) |
|---|---|---|---|---|---|---|---|
| 1 | $C_3F_6$ | 22 | 0 | 400 | 40 | 1200 | 2000 |
| 2 | $C_3HF_7$ | 18 | 0 | 400 | 40 | 1275 | 2000 |
| 3 | $C_3HF_7$ | 22 | 0 | 400 | 44 | 1075 | 2000 |
| 4 | $C_3HF_7$ | 20 | 0 | 400 | 40 | 1200 | 1600 |
| 5 | $C_3H_2F_6$ | 23 | 0 | 300 | 20 | 1000 | 2000 |
| 6.1 | $C_3F_8$ | 18 | 0 | 400 | 40 | 1400 | 2000 |
| 6.2 | $C_3H_2F_6$ | 24 | 0 | 400 | 40 | 1275 | 1800 |
| 7 | $C_3F_8$ | 18 | 0 | 400 | 40 | 1400 | 2000 |
| 8 | $C_3F_8$ | 20 | 0 | 600 | 65 | 1700 | 2000 |
| 9.1 | $C_3F_8$ | 18 | 1 | 400 | 36 | 1400 | 1500 |
| 9.2 | $C_3F_8$ | 15 | 25 | 400 | 34 | 1500 | 1925 |
| 10.1 | $C_3F_8$ | 18 | 1 | 400 | 40 | 1400 | 2000 |
| 10.2 | $C_3F_8$ | 13 | 25 | 400 | 38 | 1400 | 2000 |

One compound related to octofluoropropane is hexafluoropropylene ($C_3F_6$). This compound is a unsaturated analog of $C_3F_8$ and has one double carbon bond. Yanagida has reported in the aforecited U.S. patent the cyclic analog hexafluoropropane c-$C_3F_6$ as an oxide etching gas and has promoted the use of hexafluoropropylene in the aforecited Japanese applications.

EXAMPLE 1

In the first example, hexafluoropropylene was used as the fluorocarbon with about 18 times as much argon with a pressure of 40 milliTorr. An oxide covered substrate was used in this and the following three examples to test over etching. After the etching, polymer layers covered the top and side wall of the nitride, providing protection of the nitride so there was no nitride loss. Nonetheless, no etch stopping was observed.

Other fluoropropylenes such as hydrofluoropropylenes are expected to provide similar results.

Two other fluorocarbons useful in oxide etching are heptafluoropropane and hexafluoropropane ($C_3HF_7$ and $C_3H_2F_6$). Each of these can be decomposed into three monomers —$CF_2$— with the heptafluoropropane additionally producing HF and the hexafluoropropane additionally producing $H_2$. Both HF and $H_2$ are volatile, and $H_2$ has been used as an additive for selective fluorocarbon etching of oxide.

EXAMPLE 2

In the second example, heptafluoropropane was used as the fluorocarbon with about 22 times as much argon. The isomer $CHF_2$—$CF_2$—$CF_3$ was used, but the choice of isomer is not believed to be important. The pressure remained the same. There was no visible nitride loss.

EXAMPLE 3

The third example used the same etching gas as did the second example. However, in the third example as compared to the second example, the fluorocarbon flow was increased, the pressure was increased, and the source power was reduced. Each of these changes would tend in the same direction to increase etch stop. Nonetheless, the results were nearly indistinguishable between the two examples with no etch stop and no observable nitride corner loss.

EXAMPLE 4

The fourth example also used heptafluoropropane with conditions somewhat intermediate those of the second and third examples. There was no etch stop, and only minimal etching of the nitride corner occurred.

The above three examples demonstrate that changes in the process parameters do not greatly affect the selectivity, and etch stopping does not occur under any of these conditions. That is, in the demonstrated process the process window is wide. The process window for the ratio of the flow rates of the argon to the fluoropropane was demonstrated to extend between about 18 and 23.

EXAMPLE 5

In the fifth example, hexafluoropropane ($C_3H_2F_6$) was used as the principal etching gas. The isomer $CF_3$—CHF—$CHF_2$ was used, but the use of other isomers is not expected to greatly affect the process. The conditions were similar to the $C_3HF_7$ examples, but the pressure was reduced by half. Again, no corner nitride loss and no etch stop was observed. The oxide etch rate measured on a planar sample was 644 nm/min.

EXAMPLE 6

The sixth example was a two-step process. In the first step, $C_3F_8$ was used as a hydrogen-free fluorocarbon for a 100 second etch. In the second step, the power was reduced, and $C_3H_2F_6$ was used as the fluorocarbon for a 130 second etch. This sample had a thicker oxide layer. The first etch step is considered to be faster but less selective. Selectivity is supplied by the second step. This example used a silicon dioxide substrate to test the over etch. Nitride comer loss was less than 20 nm.

Some further examples were tested in which octafluoropropane ($C_3F_8$) by itself or in combination with varying amounts of the polymer-former difluoromethane ($CH_2F_2$) was added to the etching gas.

EXAMPLE 7

The seventh example used $C_3F_8$ as the only fluorocarbon, and no $CH_2F_2$ was used. The argon flow was 22 times that of the $C_3F_8$. The etch rate was 950 nm/min, higher than with the hydrofluoropropanes, and the nitride corner selectivity was about 32. This example also forms the baseline for the addition of the $CH_2F_2$.

EXAMPLE 8

The eighth example was similar to the seventh example, but no $CH_2F_2$ as used, and the pressure and argon flow were somewhat higher. The net etch rate was 1085 nm/min, higher than with the hydrofluoropropanes, and the nitride corner selectivity was 27, not significantly different from the seventh example.

The seventh and eighth example show that a wide process window is available with $C_3F_8$ under these conditions.

The first through eighth examples all show a satisfactorily selective oxide etch resistant to etch stop with fluoropropylene and various fluoropropanes. For an optimized etch process, these gases can be additively combined in experimentally determined proportions.

EXAMPLE 9

The ninth example was a two step process, intended to increase the effective etch rate for a thicker oxide. In the first 70s etching step a minimal amount of $CH_2F_2$ was used while in the second 100s etching step more $CH_2F_2$ than $C_3F_8$. Polymer protection is considered more necessary in the final stages of etching, particularly when a significant over etch is performed. A silicon dioxide substrate was used in this example to enable a measurement of over etching. The over etching produced a V-shaped groove in the oxide layer, and the nitride corner loss was less than 40 nm.

EXAMPLE 10

The tenth example used process conditions similar to the ninth example, but the source power was somewhat lower in the second step, the $C_3F_8$ flow was lower, and the pressure was higher. The nitride corner loss was less than 20 nm.

The ninth and tenth examples used the combination of octafluoropropane and a hydrofluoroalkane, specifically difluoromethane, $CH_2F_2$, to produce a satisfactorily selective oxide etch. The combination of an fluoropropane or fluoropropylene with a lower-order hydrofluoroalkane provides additional process flexibility and room for optimization.

The above processes can be modified by the addition of carbon monoxide, nitrogen, or oxygen, all of which are known to enhance selectivity and increase the etch stop margin. However, in the disclosed examples no carbon monoxide is used. An insubstantial amount of carbon monoxide or other additive is defined as less than 20% of the fluorocarbon content.

The above examples show that all of the principal etching gases hexafluoropropylene, octafluoropropane, heptafluoropropane, and hexafluoropropane provide effective oxide etching, particularly in a low-pressure, high-density plasma.

The experimental pressures were all below 100 milliTorr with most of them below 50 milliTorr. Similar results are expected down to at least 10 milliTorr and possibly lower. The low pressure is particularly effective in a high-density plasma with bias power within a factor of two or four of the source power in achieving a highly anisotropic etch without etch stop in a high-aspect ratio hole.

All of the examples used a high argon content of at least 10 times that of the fluoropropane and, in some cases, of the combined fluorocarbon and lower-order hydrofluoroalkane. The high argon flow is believed to promote the anisotropic etch, particularly in a high-density plasma and with strong bias power and to prevent etch stop. Similar results are expected for a ratio of inert gas to active, fluorocarbon gas down to about 2 or 3. A ratio of more than 40 is generally impractical because of limited vacuum pumping speed in the face of a required concentration of the active etching gas.

Lower-order hydrofluoroalkanes the than difluoromethane are believed to provide similar control of the process, enabling a wider process window.

Although all the examples used a relatively high-temperature scavenger, good effects are expected for a low-temperature process. Nonetheless, the scavenger is expected to be beneficial in many circumstances. Alternatively, the fluorine can be scavenged by RF biasing a silicon counter electrode to thereby activate the silicon or by injecting silane or similar Si-containing gases into the chamber.

As stated above, after completion of the initial experiments establishing the results, the considerations included in arriving at the tentative recipes of TABLE 1 were also pursued. After the general trends for variations of a single variable were established, process results were determined by varying one process parameter after another in a zig-zag path across the map of process parameters.

We determined that a two-step etch process, outlined in the process flow diagram of FIG. 3, produces the best commercial result. The first etching step 60 is based on $C_3F_6$ or other fast anisotropic etching fluorocarbon in a carrier gas of a chemically inactive gas such as argon so as to quickly etch a vertical hole part way through the oxide. It is believed that the argon does not chemically react but that argon ions are accelerated across the plasma sheath and ballistically strike the reactive wafer surface to thereby supply energy to the etching process. This effect is sometimes referred to as reactive ion etching (RIE). The selectivity to nitride need not be high in the first step 60 although some selectivity is desired so as to extend the process window to include within the first step 60 a short time in which the underlying nitride is exposed.

In a one-time qualification step 62, the best combination of $C_3F_6$ and a hydrofluorocarbon is selected based upon the conflicting demands of selectivity and no etch stop, and the optimized combination also depends upon the precise material composition and device structure. The two tested examples were $C_3F_6$ as the main etching gas and the additive polymer former being a lesser amount of either $CH_2F_2$ or $C_3H_2F_2$, also in the presence of argon.

The second etching step 64 completes the etching of the hole down to the underlying nitride. The etching gas includes $C_3F_6$ and the selected hydrofluorocarbon, as well as the argon carrier. The second step exposes the nitride and so requires a high selectivity to nitride.

In the immediate parent U.S. patent application Ser. No. 08/964,504, filed Nov. 5, 1997, we reported the chemistry centered on $C_3H_2F_6$ but suggested that $C_3F_6$ could be used in combination with it to control polymerization.

Here, a baseline process based on $C_3F_6$ has been developed for a SAC structure similar to that of FIG. 1. The two-step process is summarized in TABLE 2 except for the active fluoropropylene and hydrofluorocarbons.

TABLE 2

|  | Step 1 | Step 2 |
| --- | --- | --- |
| Ar (sccm) | 100 | 100 |
| Inner Source Power (W) | 300 | 300 |
| Outer Source Power (W) | 1150 | 1150 |
| Bias Power (W) | 2000 | 2000 |
| Pressure (mTorr) | 8 | 9 |
| Roof (° C.) | 200 | 200 |
| Ring (° C.) | 270 | 270 |
| Chiller (° C.) | 10 | 10 |
| He Pressure (Torr) | 7 | 7 |
| Etch Time (s) | 40 | 40 |

Thus, exclusive of the active processing gases, the two steps differ only by a small difference in the chamber pressure and little or no change in the other chamber parameters, thereby advantageously not requiring significant chamber reconfiguration, such as for the temperatures, between the two steps.

EXAMPLE 11

In one example, $C_3F_6$ was used as the only active processing gas in both steps with a flow of 24 sccm in the first step and a variable flow in the second step. The samples had a critical dimension of either 0.35 μm or 0.4 μm, an oxide thickness of 1 μm and a nitride shoulder height of 0.6 μm. A very good process was obtained with a $C_3F_6$ flow in the second step of 26 sccm. A nitride selectivity of at least 30 was obtained with no observed etch stop. However, the process window was observed to be very narrow. At a $C_3F_6$ flow of 24 sccm, some nitride loss at the corner was observed. At a $C_3F_6$ flow of 28 sccm, etch stop was beginning to occur. Nonetheless, with an Ar:$C_3F_6$ ratio of four, a good process was obtained, albeit with a modest process window. A somewhat lower ratio may be useful for other situations, for example, a ratio as low as two.

EXAMPLE 12

An example used a similar SAC structure with a critical dimension of 0.35 μm with a varying amount of $C_3F_6$ in the second step in the presence of a substantial amount of $CH_2F_2$, as summarized in TABLE 3.

TABLE 3

|  | Step 1 | Step 2 |
| --- | --- | --- |
| $C_3F_6$ (sccm) | 24 | 16–26 |
| $CH_2F_2$ (sccm) | 1 | 15 |
| Ar (sccm) | 100 | 100 |

With a $C_3F_6$ flow in the second step of between 18 and 24 sccm, no nitride loss and no etch stop were observed. However, at a flow of 16 sccm, some nitride corner loss was observed, and, at a flow of 26 sccm, slight etch stop was observed. Thus, a central value of $C_3F_6$ flow of 21 sccm produces a good process with a window of about ±4 sccm.

EXAMPLE 13

In a companion example, the amount of $CH_2F_2$ was varied in the second step, as summarized in TABLE 4. In this example, the critical dimension was 0.4 cm.

TABLE 4

|  | Step 1 | Step 2 |
|---|---|---|
| $C_3F_6$ (sccm) | 24 | 22 |
| $CH_2F_2$ (sccm) | 1 | 10–20 |
| Ar (sccm) | 100 | 100 |

A good process was observed at $CH_2F_2$ flows of 10, 15, and 20 sccm with no nitride loss and no etch stop. These results demonstrate a process window of ±5 sccm about a central flow of 15 sccm of $CH_2F_2$.

The respective process windows of Examples 12 and 13 demonstrate respective process windows of 38% and 67% in percentage terms and ±4 and ±5 sccm in absolute terms. The wide process window expressed in percentages manifest a great insensitivity to chamber and temporal variations while the wide flow process window in absolute flow rates demonstrate that typical mass flow controllers can provide more than adequate flow control. The width of the process window depends upon many factors, including the design of plasma reactor and the structure being etched, and the best recipe and associated process window need to be established or at least tested for each new use.

Two other examples not specifically detailed repeated Examples 12 and 13 but in a different chamber of the same design. Equally acceptable results were observed. This chamber-to-chamber reproducibility is important to eliminate the need to requalify or recalibrate the process for each chamber that is manufactured.

The above two examples establish the process windows for the two most important gas flows. However, there are several other process variables that may affect the nitride selectivity and etch stop as well as the etch rate. Rather than separately establishing a process window for each of the important process variables, a seven-variable two-level DOE (design of experiment) orthogonal matrix was designed to test the process window when all seven important variables change randomly. Out of these eight test conditions, the most and least selective process conditions are tabulated in TABLE 5 for the second step. The process conditions of the first step remain substantially the same between the two runs.

TABLE 5

|  | Most Selective | | Least Selective | |
|---|---|---|---|---|
|  | Step 1 | Step 2 | Step 1 | Step 2 |
| $C_3F_6$ (sccm) | 24 | 1 | 24 | 15 |
| $CH_2F_2$ (sccm) | 1 | 12 | 1 | 12 |
| Ar (sccm) | 100 | 100 | 100 | 100 |
| Inner Source Power (W) | 300 | 280 | 300 | 321 |
| Outer Source Power (W) | 1150 | 1070 | 1150 | 1229 |
| Bias Power (W) | 2000 | 2000 | 2000 | 2000 |
| Pressure (mTorr) | 8 | 10.5 | 8 | 8.5 |
| Roof (° C.) | 180 | 180 | 200 | 200 |
| Ring (° C.) | 270 | 270 | 270 | 270 |
| Chiller (° C.) | 8 | 8 | 12 | 12 |
| He Pressure (Torr) | 8 | 8 | 8 | 8 |
| Etch Time (s) | 40 | 50 | 40 | 45 |

For the two extreme runs of the examples, fully adequate results were observe—nitride selectivity of at least 30:1 and no etch stop. Thus, it is believed that more than adequate results will be obtained for any value of any of the process parameters of TABLE 3 falling within the listed respective range.

To further accommodate process variation, the etch time in the second step of the above examples has been increased to accomplish an over etch of about 30% over what is designed to be necessary. It has been observed that a further increase of over etch to 50% does not introduce observable nitride loss at the corner.

EXAMPLE 15

The invention has also been applied to another structure similar to the SAC structure of FIG. 1 except the layer 18 of silicon nitride had a thickness of 400 nm and a composition such that it tended to be somewhat etched in the processing conditions favoring oxide etch. Examples of such a weak nitride include silicon oxynitride and PECVD nitride. Extreme nitride selectivity is required for these types of nitride relative to the selectivity to the above dissussed forms of silicon nitride, such as LPCVD nitride. We determined that the selectivity afforded by the $C_3F_6$:$CH_2F_2$ recipe of Examples 11 through 14 was insufficient. But we also observed that even better selectivity could be obtained with a combination of the primary etchant $C_6F_6$ and the additive $C_3H_2F_6$. The additive is considered to be both a polymer former and an etchant. It has the same C:F ratio as $C_3F_6$ but also contains additional hydrogen favoring polymerization.

A satisfactory etch was achieved using the two-step recipe summarized in TABLE 6.

TABLE 6

|  | Step 1 | Step 2 |
|---|---|---|
| $C_3F_6$ (sccm) | 24 | 9 |
| $C_3H_2F_6$ (sccm) | 9 | 28 |
| Ar (sccm) | 100 | 100 |
| Inner Source Power (W) | 250 | 223 |
| Outer Source Power (W) | 1150 | 1027 |
| Bias Power (W) | 2000 | 2000 |
| Pressure (mTorr) | 9 | 9 |
| Roof (° C.) | 200 | 200 |
| Ring (° C.) | 300 | 300 |
| Chiller (° C.) | 10 | 10 |
| He Pressure (Torr) | 10 | 10 |
| Etch Time (s) | 20 | 60 |

The process produced a good etch with nitride corner loss of less than 10 nm and with no etch stop. The critical second step uses more $C_3H_2F_6$ than $C_3F_2$, and the amount of Ar is more than twice the sum of the two active gases. Although a process window has not been established, it is estimated that good results can be obtained at least within a range of 2 to 5 for the volumetric ratio between $C_3H_2F_6$ and $C_3F_6$.

Similarly, the etching process of the invention can be applied to etching oxide over other substrates containing only a small amount of oxygen. Examples of such substrate materials are titanium nitride (TiN), silicon, polysilicon, silicides such as $TiSi_x$, $WSi_x$, metals such as aluminum and copper, and others.

Although the above examples used either $CH_2F_2$ or $C_3H_2F_6$ as the polymer former, other hydrofluorocarbons can perform a similar function, assuming that the C:F ratio is equal to or greater than ½ and there is some hydrogen. Either alkanes, alkenes, or alkynes can conform to these requirements, and cyclic forms are included. $CH_3F$ has already been mentioned. $C_3H_3F_5$ is expected to provide similar effects as $C_3H_2F_6$. The partially fluorinated ethanes are expected to similarly provide good results since the bracketing methanes and propanes have already been tested.

Hydrofluoropropylenes, especially $C_3HF_5$ and $C_3H_2F_4$, are expected to provide results similar to those of $C_3F_6$.

Although the above examples used a solid silicon scavenger held at 200° C., the invention is not so limited. Higher temperatures have been observed in some situations to provide superior results. Somewhat lower temperatures down to about 150° C. provide significant scavenging effects, especially when used in combination with other scavenging techniques, such as RF biasing a silicon electrode or adding a silicon-containing gas such as silane.

Although the experimental examples were tested in an inductively coupled IPS chamber, the process of the invention can be used with other chambers, including those relying on capacitive coupling of RF energy into the chamber to create and support the plasma. It is believed that the process is particularly advantageous in a high-density plasma (HDP) reactor. Although inductively coupled HDP reactors are most popular, there are other types, such as electron-cyclotron resonance and remote plasma sources. A high-density plasma may be defined as a plasma filling the space it is within and having an ion density within that space of at least $10^{11}$ $cm^{-3}$.

The invention provides a number of important advantages. It can etch demanding geometries with high selectivity and no etch stop. The recipes to accomplish this have relatively wide process windows. There is enough choice of gases, their relative amounts, and other process variables to afford the ability to tune the process of the invention to a particular material and structure.

What is claimed is:

1. A process of etching an oxide layer formed on a substrate and comprising silicon and oxygen overlying a non-oxide layer comprising silicon but substantially less oxygen than in said oxide layer, comprising the steps of:
    placing said substrate into a plasma reaction chamber;
    admitting into said chamber an etching gas comprising a fluoropropylene, a hydrofluorocarbon, and an inert gas; and
    exciting said etching gas into a plasma, wherein the proportions of said fluoropropylene and said hydrofluorocarbon are selected such that said etching gas can etch a hole through said oxide layer with high selectivity to said non-oxide layer and without producing etch stop in said hole;
    wherein the proportions of said fluoropropylene, said hydrofluorocarbon and said inert gas are selected such that said etching gas can etch a hole having an aspect ratio of at least 2 through said oxide layer with a selectivity to said non-oxide layer of at least 20:1 and without producing etch stop in said hole.

2. The process of claim 1, wherein the proportions of said fluoropropylene and said hydrofluorocarbon are selected to provide a process window of at least 30% for said fluoropropylene and said hydrofluorocarbon.

3. The process of claimed 1, wherein said hydrofluorocarbon comprises $CH_2F_2$.

4. The process of claim 3, wherein an amount of said hydrofluorocarbon varies by no more than 50% from an amount of said fluoropropylene.

5. The process of claim 1, wherein said hydrofluorocarbon comprises $C_3H_2F_6$.

6. The process of claim 1, wherein said non-oxide layer principally comprises silicon.

7. The process of claim 1, wherein said non-oxide layer comprises silicon nitride.

8. The process of claim 1, wherein said non-oxide layer comprises titanium nitride.

9. The process of claim 1, wherein said non-oxide layer comprises silicon.

10. The process of claim 9, wherein said third amount of said argon is at least twice than a sum of said first and second amounts of said fluoropropylene and said hydrofluorocarbon.

11. The process of claim 1, wherein said exciting step excites said plasma into a high-density plasma.

12. The process of claim 1, wherein said exciting step includes inductively coupling RF energy into said chamber.

13. The process of claim 1, further comprising placing a silicon-containing element of said chamber in contact with said plasma to scavenge fluorine from said plasma and maintaining said element at a temperature of at least 150° C.

14. The process of claim 13, wherein said temperature is at least 200° C.

15. The process of claim 1, wherein said admitting step admits said inert gas in an amount at least twice a sum of respective amounts of said fluoropropylene and said hydrofluorocarbon.

16. The process of claim 15, wherein said admitting step admits said inert gas in said amount at least ten times said respective amounts of said fluoropropylene.

17. The process of claim 1, wherein said fluoropropylene comprises $C_3F_6$.

18. A process of etching an oxide layer formed on a substrate and comprising silicon and oxygen overlying a non-oxide layer comprising silicon but substantially less oxygen than in said oxide layer comprising the steps of:
    placing said substrate into a plasma reaction chamber;
    admitting into said chamber an etching a gas comprising fluoropropylene and $C_6H_2F_2$, wherein an amount of said $C_3H_2F_6$ is between 2 and 5 times the amount of said fluoropropylene and exciting said etching gas into a plasma.

19. A process of etching an oxide layer formed on a substrate and comprising silicon and oxygen overlying a non-oxide layer comprising silicon but substantially less oxygen than in said oxide layer, comprising the steps of:
    placing said substrate into a plasma reaction chamber;
    a first step of admitting into said chamber a first etching gas;
    exciting said first etching gas into a plasma;
    a second step of admitting into said chamber a second etching gas comprising fluoropropylene and a hydrofluorocarbon, wherein said first etching gas provides in etching said oxide layer less selectivity to said non-oxide layer than does said second etching gas; and
    exciting said second etching gas into a plasma.

20. The process of claim 19, wherein said second etching gas comprises more hydrofluorocarbon relative to fluoropropylene than in said first etching gas.

21. The process of claim 20, said hydrofluorocarbon in said first and second etching gases comprises $CH_2F_2$.

22. The process of claim 20, wherein said first and second etching gases additionally comprise argon.

23. A process for etching in a substrate a hole through a layer of silicon oxide and stopping on an underlying layer of silicon nitride, comprising the steps of:

placing said substrate into a plasma reaction chamber;

admitting a first etching gas into said chamber;

exciting said first etching gas into a plasma to etch said hole part way through said oxide layer;

admitting a second etching gas into chamber, said second etching gas comprising fluoropropylene, a hydrofluorocarbon, and argon; and exciting said second etching gas into a plasma to etch said hole through said oxide layer and down to said nitride layer.

24. The process of claim 23, wherein said first etching gas is different from said second etching gas and comprises fluoropropylene and argon.

25. The process of claim 24, wherein said two exciting steps excites said gases into respective high-density plasmas.

26. The process of claim 24, wherein said two exciting steps includes inductively coupling RF energy into said reaction chamber.

* * * * *